United States Patent [19]
Imura et al.

[11] Patent Number: 5,949,139
[45] Date of Patent: Sep. 7, 1999

[54] SEMICONDUCTOR INTEGRATED CIRCUIT DEVICE CAPABLE OF ACHIEVING REDUCTIONS IN CHIP AREA AND CONSUMPTION POWER

[75] Inventors: Koji Imura, Nara-ken; Masaaki Tatsukawa, Tenri; Koji Komatsu, Nara, all of Japan

[73] Assignee: Sharp Kabushiki Kaisha, Osaka, Japan

[21] Appl. No.: 09/054,893

[22] Filed: Apr. 3, 1998

[30] Foreign Application Priority Data

| Apr. 25, 1997 | [JP] | Japan | 9-108669 |
| May 22, 1997 | [JP] | Japan | 9-132236 |
| May 22, 1997 | [JP] | Japan | 9-132237 |
| May 22, 1997 | [JP] | Japan | 9-132238 |

[51] Int. Cl.$^6$ ............. H01L 25/065; H01L 23/525; H01L 27/08
[52] U.S. Cl. ............. 257/723; 257/676; 257/686; 257/666
[58] Field of Search ............. 257/723, 676, 257/666, 686, 724

[56] References Cited

U.S. PATENT DOCUMENTS 5,391,917  2/1995  Gilmour et al. ............. 257/690

FOREIGN PATENT DOCUMENTS

2-87661   3/1990  Japan.
4-336461  11/1992  Japan.

Primary Examiner—Peter Toby Brown
Assistant Examiner—Hung Van Duong
Attorney, Agent, or Firm—Morrison & Foerster

[57] ABSTRACT

This is provided a dual-surface mounting type semiconductor integrated circuit device capable of achieving reductions in chip area and consumption power. In the dual-surface mounting type semiconductor integrated circuit device, a specified circuit for implementing a function common to integrated circuit chips and mounted on both surfaces of a chip mounting section of a lead frame is provided only for the integrated circuit chip of one surface, and an output signal of the specified circuit provided only for the integrated circuit chip of this one surface is transmitted to the integrated circuit chip of the other surface via bonding wires and an internal lead.

12 Claims, 8 Drawing Sheets

SEMICONDUCTOR INTEGRATED CIRCUIT DEVICE CAPABLE OF ACHIEVING REDUCTIONS IN CHIP AREA AND CONSUMPTION POWER

BACKGROUND OF THE INVENTION

The present invention relates to a resin-encapsulated type semiconductor integrated circuit device in which integrated circuit chips are mounted on both surfaces of a chip mounting section of a lead frame and the electrodes and the lead terminals of these integrated circuit chips are connected together by bonding wires.

The resin-encapsulated type semiconductor integrated circuit device has a construction in which an integrated circuit chip is mounted on a chip mounting section of a lead frame and the electrodes and the lead terminals of this integrated circuit chip are connected together by bonding wires. In an attempt at improving the functions or mounting density of such a normal resin-encapsulated type semiconductor integrated circuit device, there has been proposed a dual-surface mounting type semiconductor integrated circuit device having a construction in which integrated circuit chips are mounted on both surfaces of a chip mounting section of a lead frame.

Figure 10:
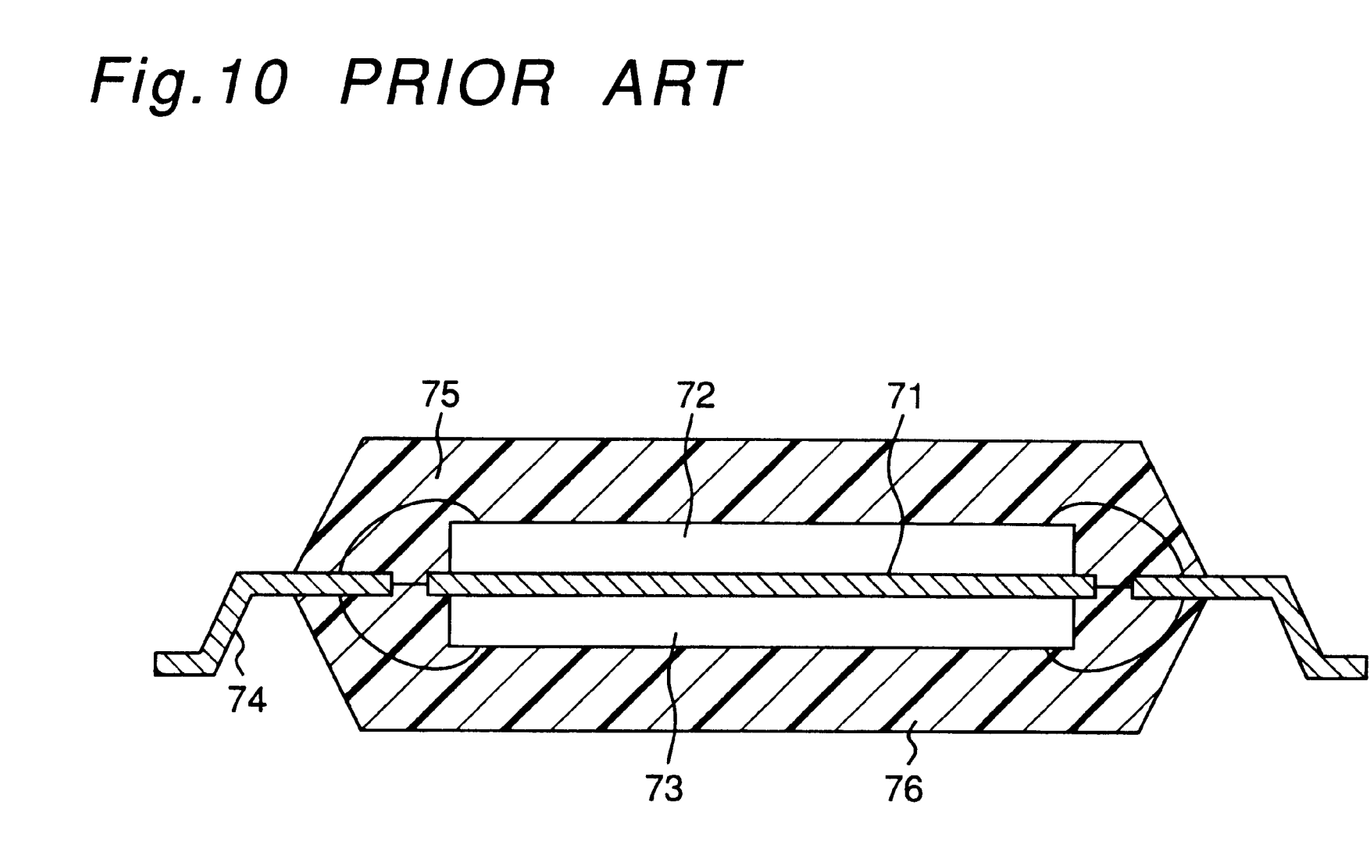
FIG. 10 is a schematic diagram of a prior art dual-surface mounting type semiconductor integrated circuit device.

FIG. 10 shows a schematic diagram of a prior art dual-surface mounting type semiconductor integrated circuit device. In the figure, the reference numeral 71 denotes a chip mounting section of a lead frame, and integrated circuit chips 72 and 73 are mounted on both its surfaces. Electrodes (not shown) of the integrated circuit chips 72 and 73 are connected to lead terminals 74 by bonding wires 75. The reference numeral 76 denotes an encapsulation resin for encapsulating the integrated circuit chips 72 and 73 and the bonding wires 75. For example, when the integrated circuit chips 72 and 73 are memory chips having identical capacities and a double capacity is provided by dual-surface mounting, there can be obtained a semiconductor integrated circuit device whose function (capacity) is doubled although it is identical in terms of area by mounting two memory chips which differ from each other only in their decoder circuit portions for outputting a selection signal to the internal circuits based on a chip selection signal input and have identical constructions of the other portions on both the surfaces of the chip mounting section (note that one chip has a laterally (or vertically) inverted structure relative to the other chip) and connecting the corresponding electrodes of the memory chips to an identical lead terminal. Such a semiconductor integrated circuit device is disclosed in, for example, the document of Japanese Patent Laid-Open Publication No. HEI 2-87661.

However, the above prior art dual-surface mounting type semiconductor integrated circuit device has the following problems.

That is, the above prior art dual-surface mounting type semiconductor integrated circuit device has the problem that the circuits of the two integrated circuit chips wastefully overlap each other, i.e., the problem that both the integrated circuit chips sometimes individually have a circuit for implementing a mutually identical function, causing a waste in terms of chip area or consumption power in the case.

SUMMARY OF THE INVENTION

The object of the present invention is therefore to solve the aforementioned problems and provide a dual-surface mounting type semiconductor integrated circuit device capable of achieving reductions in chip area and consumption power.

In order to achieve the aforementioned object, there is provided a resin-encapsulated type semiconductor integrated circuit device in which integrated circuit chips are mounted on both surfaces of a chip mounting section of a lead frame and electrodes and lead terminals of these integrated circuit chips are connected to each other by bonding wires. In this device, each of the two integrated circuit chips mounted on both the surfaces of the chip mounting section includes one internal circuit, only one specified circuit is provided for the two internal circuits of the two integrated circuit chips, at least part of the one specified circuit is provided inside the integrated circuit chip of one surface of the chip mounting section, and the specified circuit is connected to the two internal circuits.

In the above resin-encapsulated type semiconductor integrated circuit device of the present invention, each of the two integrated circuit chips mounted on both the surfaces of the chip mounting section of the lead frame includes one internal circuit, and at least part of the one specified circuit connected to the two internal circuits is provided inside the integrated circuit chip of the one surface of the chip mounting section. With this arrangement, input and output signals of at least part of the specified circuit can be transmitted to the integrated circuit chip of the other surface via the electrodes of both the integrated circuit chips, the bonding wires and the lead terminals, and a reduction in area of the integrated circuit chips and a reduction in consumption power can be achieved.

In one embodiment of the present invention, the specified circuit is wholly included in the integrated circuit chip of the one surface of the chip mounting section.

In one embodiment of the present invention, the specified circuit is divided into two portions, one of the portions being included in the integrated circuit chip of the one surface of the chip mounting section and the other of the portions being included in the integrated circuit chip of the other surface of the chip mounting section.

In the former embodiment, the specified circuit is wholly included in the integrated circuit chip of the one surface of the chip mounting section, and the input and output signals of the specified circuit can be transmitted to the integrated circuit chip of the other surface via the electrodes of both the integrated circuit chips, the bonding wire and the lead terminals. In the latter embodiment, one of the portions of the bisected specified circuit is included in the integrated circuit chip of the one surface of the chip mounting section, and the other portion is included in the integrated circuit chip of the other surface of the chip mounting section. With this arrangement, the input and output signals can be transmitted in a similar manner between the one of the portions of the specified circuit as well as the integrated circuit chip of the other surface and the other portion of the specified circuit as well as the integrated circuit chip of the one surface. Therefore, both the embodiments can achieve a reduction in area of the integrated circuit chips and a reduction in consumption power.

In one embodiment of the present invention, the electrode connected to the specified circuit of the integrated circuit chip of the one surface and the electrode connected to the internal circuit of the integrated circuit chip of the other surface are connected to each other by a lead which is not led to the outside and a bonding wire for connecting the lead to the electrodes.

In one embodiment of the present invention, the electrode connected to the one of the portions of the specified circuit of the integrated circuit chip of the one surface and the electrode connected to the internal circuit of the integrated circuit chip of the other surface are connected to each other, and the electrode connected to the other of the portions of the specified circuit of the integrated circuit chip of the other surface and the electrode connected to the internal circuit of the integrated circuit chip of the one surface are connected to each other, the connections each being achieved by leads which are not led to the outside and bonding wires for connecting the leads to the electrodes.

In the former embodiment, the input and output signals of the specified circuit included in only the integrated circuit chip of the one surface of the chip mounting section are transmitted to the internal circuit of the integrated circuit chip of the other surface via the electrodes of both the integrated circuit chips, the bonding wires and the internal leads. In the latter embodiment, the input and output signals of one of the bisected portions of the specified circuit included in the integrated circuit chip of the one surface of the chip mounting section are transmitted to the internal circuit of the integrated circuit chip of the other surface of the chip mounting section, while the input and output signals of the other of the portions of the specified circuit included in the integrated circuit chip of the other surface of the chip mounting section are transmitted to the internal circuit of the integrated circuit chip of the one surface of the chip mounting section, in a similar manner. Therefore, both the embodiments are able to achieve a reduction in area of the integrated circuit chips and a reduction in consumption power and assure the insulation of the input and output signals of the specified circuit with respect to the outside.

In one embodiment of the present invention, the output signal of the specified circuit of the integrated circuit chip of the one surface is transmitted to the integrated circuit chip of the other surface via the chip mounting section, and in particular, the specified circuit is a substrate bias generator circuit.

In the above embodiment, the output signal of the specified circuit of a substrate bias circuit or the like included in only the integrated circuit chip of the one surface of the chip mounting section is transmitted to the integrated circuit chip of the other surface via the chip mounting section. This arrangement obviates the need for providing the specified circuit inside the integrated circuit chip of the other surface, so that a reduction in area of the integrated circuit chips and a reduction in consumption power can be achieved.

In one embodiment of the present invention, each of the integrated circuit chips is a memory chip and the specified circuit is an address transition detector circuit.

In the above embodiment, memory chips serving as the integrated circuit chips are mounted on both the surfaces of the chip mounting section, and the address transition detector circuit serving as the specified circuit is wholly included in only the memory chip of the one surface or constructed so as to have a half portion provided in the memory chip of the one surface and have the remaining half portion included in the memory chip of the other surface. With this arrangement, the address transition detector circuit is allowed to be one in number or allowed to have half areas, so that a reduction in area of the memory chip and a reduction in consumption power can be achieved.

In one embodiment of the present invention, the electrodes of the integrated circuit chips mounted on both the surfaces of the chip mounting section are each connected to a common lead terminal, and the specified circuit is an electrostatic protector circuit provided for the common lead terminal.

In the above embodiment, the electrostatic protector circuit serving as the specified circuit is wholly included in the integrated circuit chip of the one surface of the chip mounting section or constructed so as to have a half portion provided in the integrated circuit chip of the one surface and have the remaining half portion included in the integrated circuit chip of the other surface. Therefore, wasteful circuits can be eliminated, so that a reduction in chip area can be achieved and an increase in parasitic capacitance to be applied to each electrode can be prevented, thereby enabling the prevention of an increase in signal delay.

In one embodiment of the present invention, the specified circuit is a substrate bias generator circuit, and a threshold voltage of a MOS transistor provided inside the integrated circuit chip of the other surface is set lower than a threshold voltage when this MOS (Metal-Oxide-Semiconductor) transistor is used in a state in which a bias voltage from the substrate bias generator circuit is not applied to its substrate.

In the above embodiment, the substrate bias generator circuit serving as the specified circuit is included in the integrated circuit chip of the one surface of the chip mounting section, and a bias voltage which is the output signal of the substrate bias generator circuit is applied from the substrate of the one surface to the substrate of the integrated circuit chip of the other surface via the chip mounting section, consequently increasing the threshold voltage of the MOS transistor inside the integrated circuit chip of the other surface. However, the threshold voltage of this MOS transistor is set lower than the threshold voltage when the transistor is used in the state in which the bias voltage is not applied to its substrate, and therefore, this threshold voltage set low cancels the application of the bias voltage. Therefore, the MOS transistor inside the integrated circuit chip of the other surface can be operated on an appropriate input voltage without causing a cost increase as in the prior art in which the substrates of both the integrated circuit chips are insulated from each other by an insulating film or a dual structure.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be described in detail below with reference to the accompanying drawings.

Figure 1:
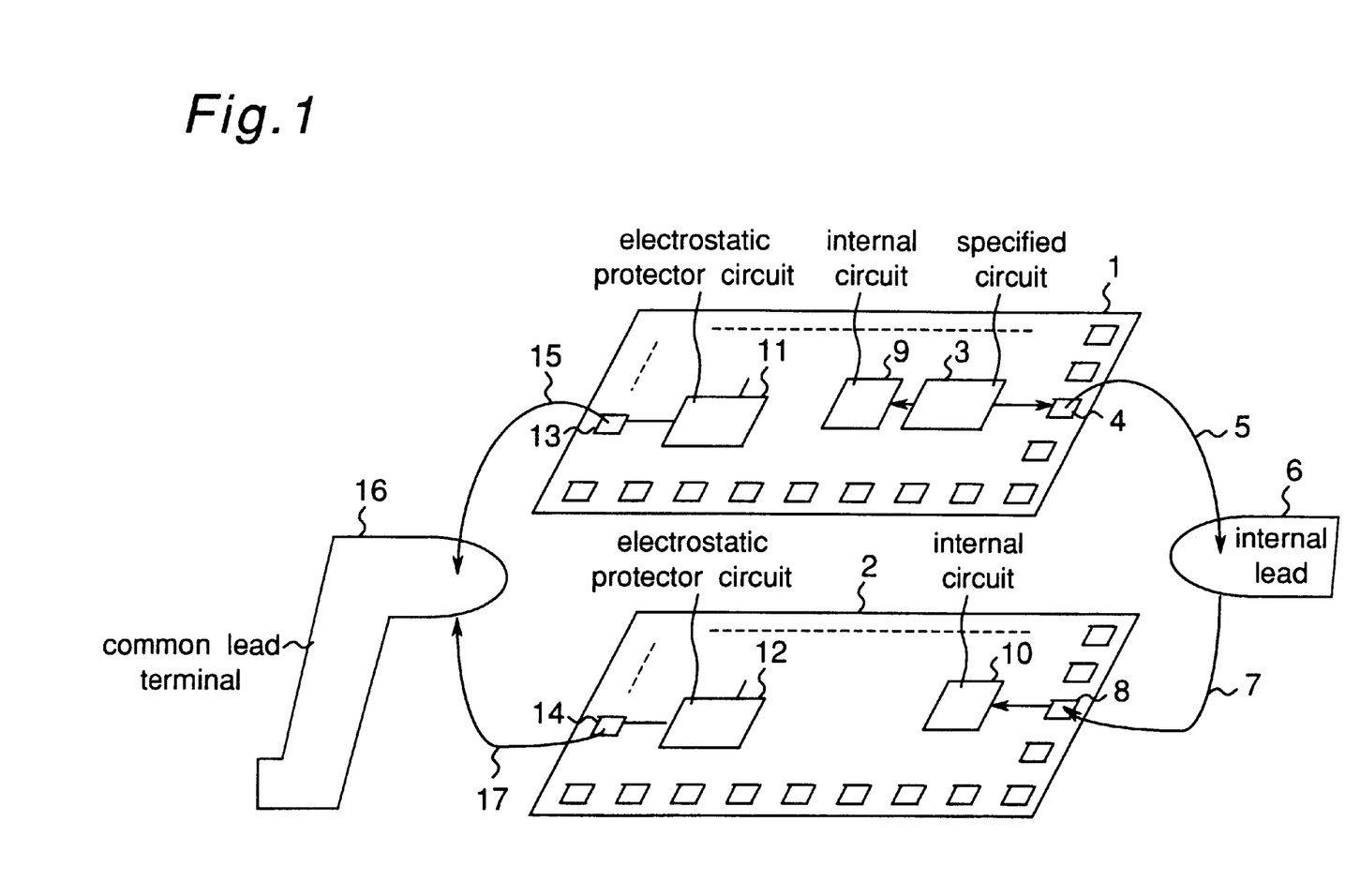
FIG. 1 is a schematic diagram showing an embodiment of the semiconductor integrated circuit device set forth in the claims 4 and 11 of the present invention.

FIG. 1 is a schematic diagram showing an embodiment of the semiconductor integrated circuit device set forth in the claims 4 and 11 of the present invention.

In terms of structure, this embodiment has the same structure as that of the prior art semiconductor integrated circuit device shown in FIG. 10, and FIG. 1 shows only its characteristic part. In FIG. 1, the reference numerals 1 and 2 denote integrated circuit chips of, for example, memory chips (DRAM, ROM (Read Only Memory) or the like) having identical capacities. In this embodiment according to the claim 4, a specified circuit 3 for implementing a function common to both the integrated circuit chips 1 and 2 is provided in only one integrated circuit chip 1. Therefore, an output signal of this specified circuit 3 is required to be transmitted to the other integrated circuit chip 2. The transmission of the output signal is executed via an electrode 4 which is provided on the integrated circuit chip 1 side and receives the output signal of the specified circuit 3, a bonding wire 5, an internal lead 6 which is embedded inside an encapsulating resin (refer to the reference numeral 76 in FIG. 10) and is not led to the outside, a bonding wire 7 and an electrode 8 of the other integrated circuit chip 2. Although one output signal line of the specified circuit 3 is shown in FIG. 1, there may, of course, be provided a plurality of lines. The reference numerals 9 and 10 denote internal circuits which receive the output signal of the specified circuit 3 in the one and the other integrated circuit chips 1 and 2, respectively.

In FIG. 1, the reference numerals 11 and 12 denote electrostatic protector circuits which will be described in detail later in an embodiment according to the claim 11 and are connected to an electrode 13 of the integrated circuit chip 1 and an electrode 14 of the integrated circuit chip 2. Both the electrodes 13 and 14 are connected to a common lead terminal 16 via bonding wires 15 and 17, and one end of this common lead terminal 16 is exposed to the outside of the encapsulating resin. It is to be noted that electrodes 4 and 8 are required to be provided with no electrostatic protector circuit since the internal lead 6 is not led out of the encapsulating resin.

Figure 2:
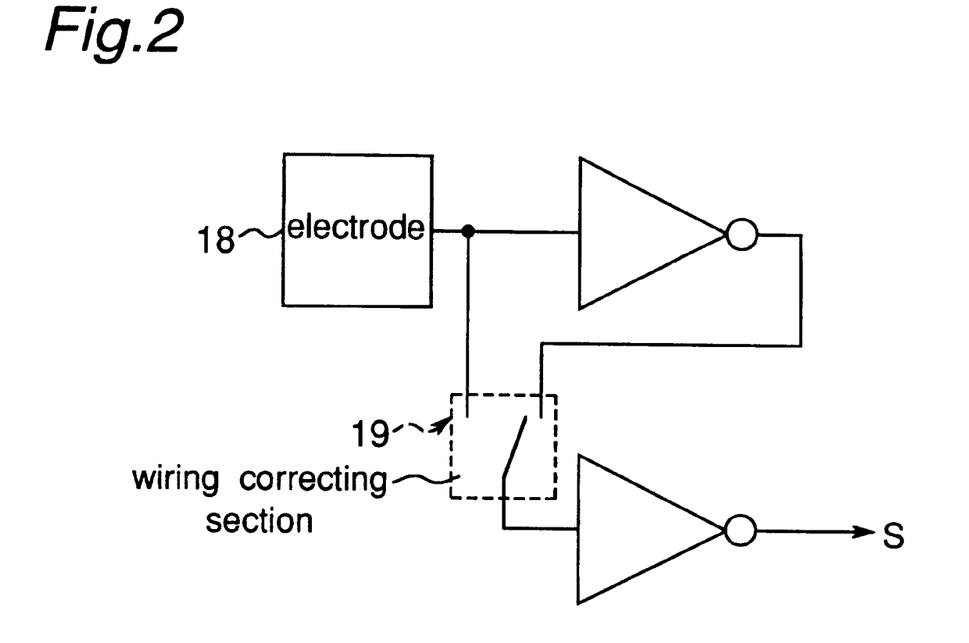
FIG. 2 is a block diagram of a chip selection control circuit provided for each of integrated circuit chips on both surfaces of a chip mounting section shown in FIG. 1.

FIG. 2 shows the construction of a chip selection control circuit provided inside each of the integrated circuit chips 1 and 2. This circuit outputs an H-level internal control signal S to either one of the integrated circuit chips 1 and 2 and outputs an L-level internal control signal S to the other by changing the connection state of a wiring correcting section 19 according to the H- or L-level of a chip selection signal inputted externally to an electrode 18, thereby selecting either one of the integrated circuit chips 1 and 2.

Although the specified circuit 3 is provided only for the one integrated circuit chip 1 in the above embodiment, it is allowed to provide a construction as set forth in the claims 3, 5 and 9, achieved by dividing the specified circuit into two parts, providing the divided one part for only the one integrated circuit chip 1, transmitting the output signal to the other integrated circuit chip 2 via a bonding wire and an internal lead, providing the divided other part for only the other integrated circuit chip 2 and transmitting the output signal to the one integrated circuit chip 1 via other bonding wire and internal lead.

The electrostatic protector circuits 11 and 12 are provided separately into both the integrated circuit chips 1 and 2, so that a required electrostatic protecting function can be obtained by the two parts.

Figure 3:
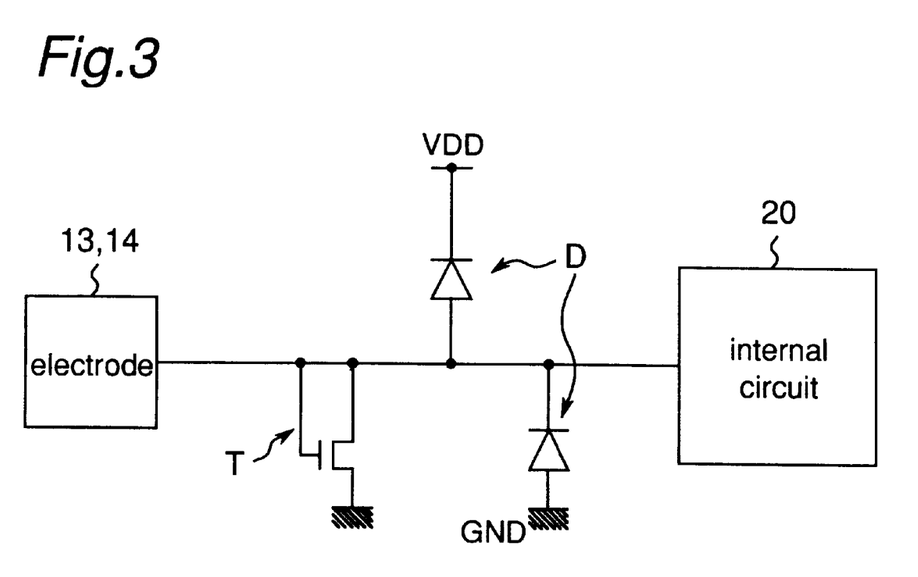
FIG. 3 is a block diagram of an electrostatic protector circuit provided for each of the integrated circuit chips on both the surfaces shown in FIG. 1.

The electrostatic protector circuits 11 and 12 shunt electrostatic charges which externally enter the electrodes 13 and 14 of the integrated circuit chips 1 and 2 to the power line and the like via the bonding wires 15 and 17 and the common lead terminal 16, thereby preventing a high voltage from being applied to a circuit 20 (see FIG. 3) inside the chip for the prevention of the destruction of the circuit. As shown in FIG. 3, the electrostatic protector circuits are constructed of a transistor T, diodes D and so on and have capacitive components of a pn junction, wiring capacitance and so on.

Since the electrostatic protector circuits 11 and 12 serving as the specified circuit are thus bisected to be provided for both the integrated circuit chips 1 and 2, an area occupied by the electrostatic protector circuit with respect to the entire integrated circuit chip is reduced in comparison with the conventional case where the undivided electrostatic protector circuit is provided for both the integrated circuit chips, and the capacitive component viewed as a whole, i.e., the parasitic capacitance is reduced by half, so that the delay of the signal transmission can be prevented.

The chip mounting section of the lead frame, both surfaces of which receive the substrates of the integrated circuit chips 1 and 2 bonded to it has an electrical conductivity, and therefore, the substrate resistance between the integrated circuit chips 1 and 2 can be suppressed low. Therefore, even when the electrostatic protector circuit of the common lead terminal is provided only for one integrated circuit chip or when the electrostatic protector circuit of the two integrated circuit chips is reduced in scale to about one half, an electrostatic breakdown resistance similar to that of the semiconductor integrated circuit device comprised of the normal single-sided integrated circuit chip can be obtained.

In the above embodiment, the electrostatic protector circuits 11 and 12 for one common lead terminal 16 are provided separately at both the integrated circuit chips 1 and 2 and the specified function is obtained by a combination of the electrostatic protector circuits 11 and 12. However, it is acceptable to provide a construction in which an electrostatic protector circuit of a scale required for one common lead terminal for only either one of the integrated circuit chips. In this case, it is acceptable to provide the whole electrostatic protector circuit for all the common lead terminals only on either one of the integrated circuit chips (e.g., integrated circuit chip 1) or arrange it in a distributing manner by providing, for example, the electrostatic protector circuit for the input terminal on the integrated circuit chip 1 side and providing the electrostatic protector circuit for the output terminal on the integrated circuit chip 2 side.

Figure 4:
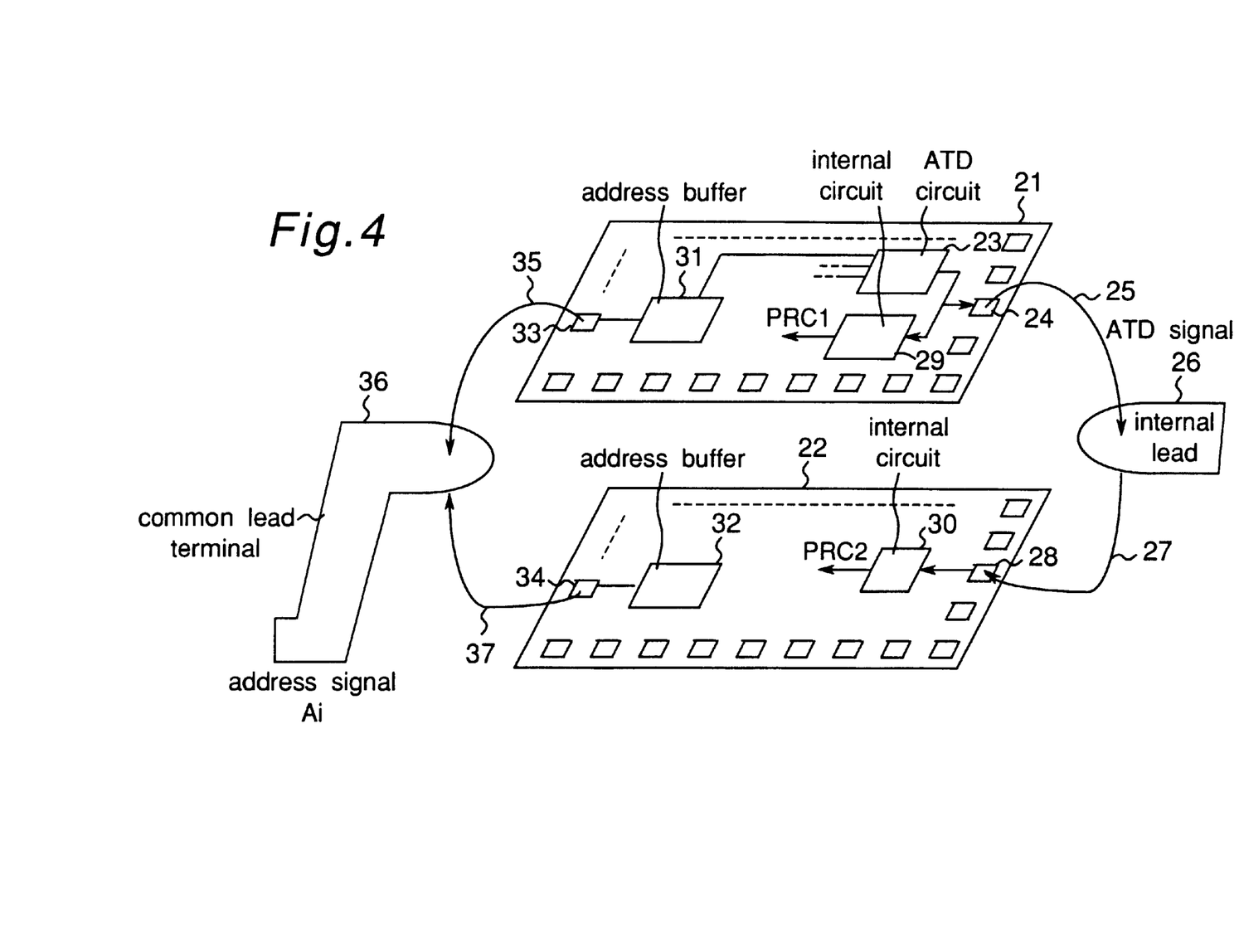
FIG. 4 is a schematic diagram showing an embodiment of the semiconductor integrated circuit device set forth in the claims 2 and 8 of the present invention.

FIG. 4 is a schematic diagram showing an embodiment according to the claims 2 and 8, in which the integrated circuit chips 1 and 2 (see FIG. 1) are served as a memory chip and the specified circuit 3 is served as an address transition detector circuit (ATD circuit).

In FIG. 4, the reference numerals 21 and 22 denote memory chips (DRAM, ROM or the like) having identical capacities. In the present embodiment, an address transition detector circuit (ATD circuit) 23 is provided only on the memory chip 21 side. Therefore, an output signal (ATD signal) of the ATD circuit 23 is required to be transmitted to the other memory chip 22. The transmission of the ATD signal is executed via an electrode 24 which receives the output signal of the ATD circuit 23, a bonding wire 25, an internal lead 26, a bonding wire 27 and an electrode 28 of the other memory chip 22. The reference numerals 29 and 30 denote internal circuits which receive the output of the ATD circuit 23 in the one and the other memory chips 21 and 22 and output, for example, bit line precharge signals PRC1 and PRC2.

The reference numerals 31 and 32 shown in FIG. 4 denote address buffer circuits connected to an address input electrode 33 of the memory chip 21 and an address input electrode 34 of the memory chip 22, respectively. Both the electrodes 33 and 34 are connected to a common lead terminal 36 via the bonding wires 35 and 37, respectively, and one end of this common lead terminal 36 is led out of the encapsulating resin.

Figure 5:
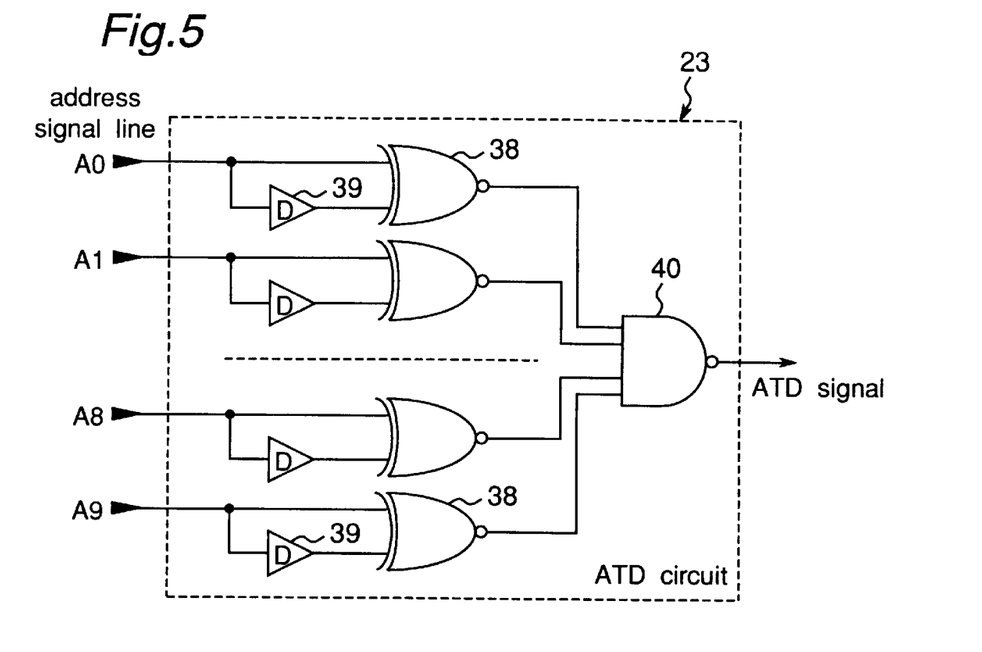
FIG. 5 is a block diagram of an ATD (Address Transition Detector) circuit provided for the memory chip on one surface shown in FIG. 4.

FIG. 5 shows an example of the construction of the ATD circuit 23, and this ATD circuit 23 is comprised of ten exclusive-OR elements 38 into which each address signal line from the address buffer 31 is inputted and an AND element 40 which receives inverted outputs of these exclusive-OR elements 38 and outputs an ATD signal as an inverted output. The exclusive-OR elements 38 are each constructed so that an address signal inputted to the address signal line Ai (i=0 to 9) is directly inputted to one input terminal and inputted to the other input terminal via a delay element 39.

Figure 6:
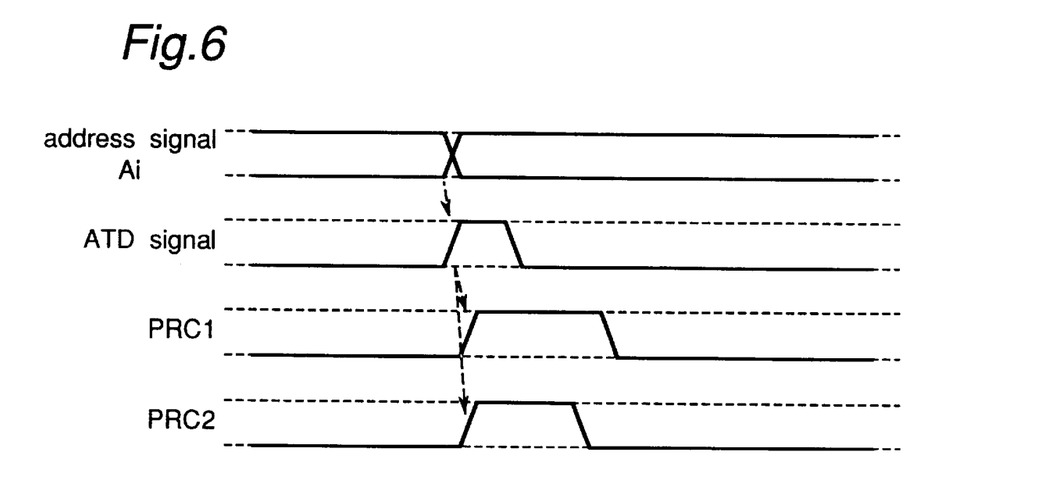
FIG. 6 is a timing chart of input and output signals of an internal circuit provided for the above ATD circuit and the memory chips on both the surfaces.

FIG. 6 shows a timing chart of the input and output signals of the ATD circuit 23 and the bit line precharge signals PRC1 and PRC2 which are the output signals of the internal circuits 29 and 30. When the input address signal Ai of either one of the exclusive-OR elements 38 changes from high to low (H→L) or low to high (L→H) as shown in the figure, then the outputs of the exclusive-OR elements 38 are changed by the delay elements 39, and consequently an ATD signal as shown in the figure is output from the AND element 40. Then, the internal circuits 29 and 30 which receive this ATD signal output the bit line precharge signals PRC1 and PRC2 as shown in the figure.

Figure 7:
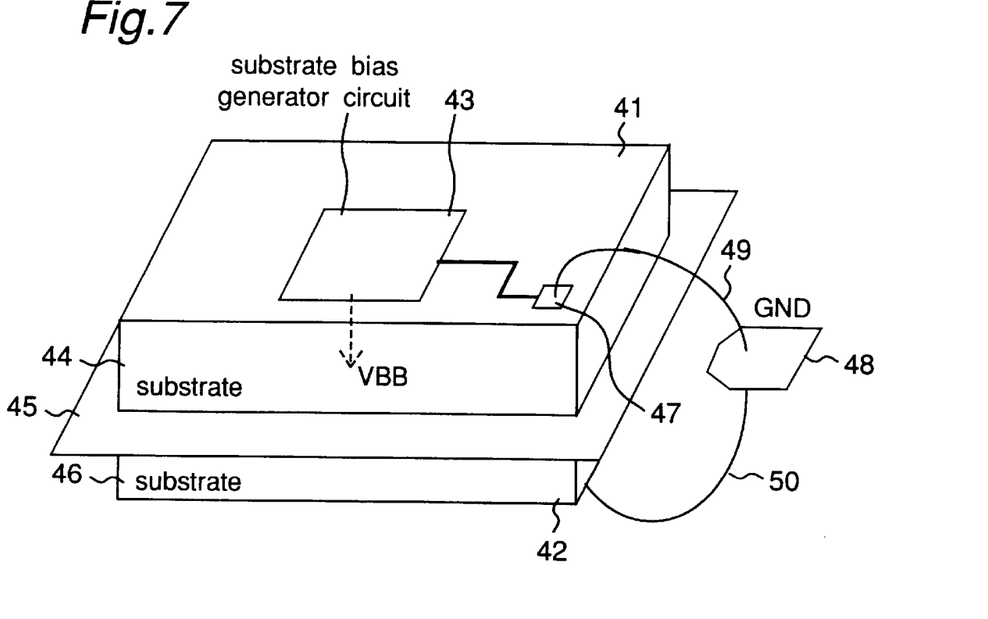
FIG. 7 is a schematic diagram showing an embodiment of the semiconductor integrated circuit device set forth in the claim 7 of the present invention.

FIG. 7 is a schematic diagram of an embodiment according to the claim 7, wherein the integrated circuit chips 1 and 2 (see FIG. 1) to be mounted on both the surfaces of a chip mounting section 45 of the lead frame are served as DRAM chips and the specified circuit 3 is served as a substrate bias generator circuit 43.

In FIG. 7, the reference numerals 41 and 42 denote DRAM chips having identical capacities. In the present embodiment, the substrate bias generator circuit 43 is provided for only the DRAM chip 41 of one surface. A negative voltage $V_{BB}$ which is an output of this substrate bias generator circuit 43 is given to the substrate 44 of the DRAM chip 41 and also given to the substrate 46 of the other DRAM chip 42 via an electrically conductive chip mounting section 45.

A GND potential output from the substrate bias generator circuit 43 is transmitted from a GND electrode 47 of the DRAM chip 41 of the one surface to the DRAM chip 42 via a bonding wire 49, a GND terminal 48, a bonding wire 50 and a GND electrode (not shown) of the other surface.

Figure 8:
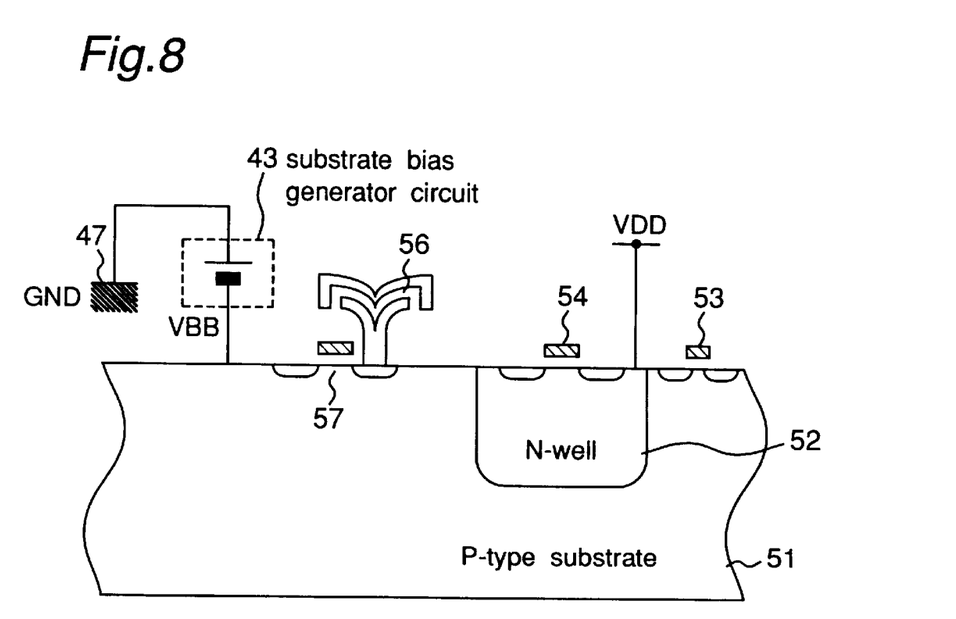
FIG. 8 is a schematic diagram of a DRAM (Dynamic Random Access Memory) chip on one surface shown in FIG. 7.

FIG. 8 shows a schematic diagram of the DRAM chip 41 of the one surface. This DRAM chip 41 has its peripheral circuit constructed by forming an n-well 52 in a portion of a surface layer of the p-type substrate 51, forming a p-channel MOS transistor 54 on this n-well 52 and forming an n-channel MOS transistor 53 on the substrate 51 excluding the n-well 52. On the substrate 51 between the substrate bias generator circuit 43 for applying the negative substrate bias voltage $V_{BB}$ to the substrate 51 and the n-well 52, there are formed an n-channel selector transistor 57 for selecting a memory cell and a memory cell capacitor 56.

As described above, by applying the substrate bias voltage $V_{BB}$ to the substrate 51, the threshold value of the selector transistor 57 increases and the leak current of the memory cell capacitor 56 reduces, thereby allowing a data retaining time to be increased.

Although only the substrate bias generator circuit 43 serving as the specified circuit is provided on the DRAM chip 41 of one surface in the above embodiment, it is also acceptable to further provide a second specified circuit at only the DRAM chip 42 of the other surface and transmit the output signal of this specified circuit to the DRAM chip 41 of the one surface via another bonding wire and an internal lead 6 (see FIG. 1) or the chip mounting section 45.

Figure 9:
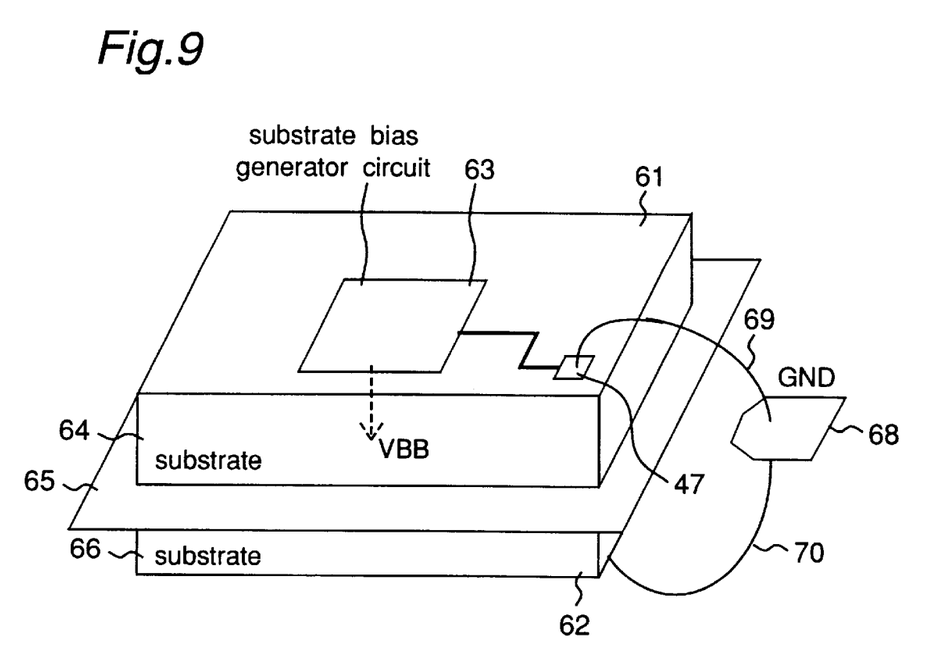
FIG. 9 is a schematic diagram of an embodiment of the semiconductor integrated circuit device set forth in the claim 12 of the present invention.

FIG. 9 is a schematic diagram of an embodiment according to the claim 12, in which the integrated circuit chips 1 and 2 (see FIG. 1) to be mounted on one and the other surfaces of the chip mounting section 65 are served as a DRAM chip 61 and a mask ROM chip 62 and the specified circuit 3 is served as a substrate bias generator circuit 63.

The structure of the semiconductor integrated circuit device shown in FIG. 9 is the same as that of the semiconductor integrated circuit device shown in FIG. 7 except for the point that the DRAM chip 42 of the other surface of the chip mounting section mentioned in conjunction with FIG. 7 is replaced by the mask ROM chip 62 and the threshold voltage of the MOS transistor provided inside this mask ROM chip 62 is set lower than the threshold voltage when this MOS transistor is used in a state in which a bias voltage from the substrate bias generator circuit 63 is not applied to its substrate 66, and therefore, no description is provided for the same components.

Since the prior art mask ROM chips have been designed as those having no substrate bias generator circuit, the substrate bias voltage $V_{BB}$ from the substrate bias generator circuit 63 on the DRAM chip 61 side is applied to the substrate 66 of the mask ROM chip 62 via the conductive chip mounting section 65 when manufactured strictly to the design. Therefore, the threshold voltage of the MOS transistor inside the mask ROM chip increases, consequently causing an operation delay and an erroneous operation due to an increase in access time. Therefore, with a view to solving this problem, there have been conventionally proposed a method for electrically separating the substrates of the chips of both the surfaces by an insulating film and a method for making the substrate have a dual structure (the document of Japanese Patent Laid-Open Publication No. HEI 8-139204). However, these methods have had the problem that an increase in number of components and processes or a cost increase due to the complication of the manufacturing processes and an increase in chip area.

In the present embodiment, the threshold voltage of the MOS transistor inside the mask ROM chip 62 is set lower than the threshold voltage when this MOS transistor is used in a state in which the bias voltage from the substrate bias generator circuit 63 is not applied to its substrate 66, thereby cancelling the increase in threshold voltage due to the application of the substrate bias voltage $V_{BB}$. Then, the setting of the MOS transistor inside the mask ROM chip 62 to the low threshold voltage can be performed in implanting impurity ions for controlling the threshold value of this MOS transistor by setting the conductive type of the impurity to be implanted or controlling the quantity of implantation according to the value of the output voltage $V_{BB}$ of the substrate bias generator circuit 63 of the DRAM chip 61, utterly obviating the need for performing a new layout work or forming a mask. Therefore, according to the present embodiment, the threshold voltage of the MOS transistor inside the mask ROM chip 62 is set to an appropriate value for the correct operation with an appropriate input voltage without causing a cost increase as in the prior art in which the substrates of the integrated circuit chips of both the surfaces are insulated from each other by an insulating film or the like, thereby preventing the occurrence of an erroneous operation and the increase in access time and allowing a reduction in chip area and a reduction in consumption power to be achieved.

It is to be noted that a selector transistor (not shown) (see the reference numeral 57 in FIG. 8) provided at the DRAM chip 61 of one surface of the chip mounting section 65 has its threshold voltage increased for the aforementioned reasons, and the leak current of the memory cell capacitor (see the reference numeral 56 in FIG. 8) is reduced, thereby allowing an increase in data retaining time to be achieved.

Furthermore, the chip selection of the DRAM chip 61 and the mask ROM chip 62 of both the surfaces of the chip mounting section is executed by the chip selection control circuit provided for each chip as described before with reference to FIG. 2.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device in which integrated circuit chips are mounted on both surfaces of a chip mounting section of a lead frame and electrodes of the integrated circuit chips and lead terminals are connected to each other by bonding wires, the two integrated circuit chips mounted on both the surfaces of the chip mounting section each including one internal circuit, only one specified circuit being provided for the two internal circuits of the two integrated circuit chips, at least part of the one specified circuit being provided inside the integrated circuit chip of one surface of the chip mounting section, and the specified circuit being connected to the two internal circuits.

2. A semiconductor integrated circuit device as claimed in claim 1, wherein the specified circuit is wholly included in the integrated circuit chip of the one surface of the chip mounting section.

3. A semiconductor integrated circuit device as claimed in claim 2, wherein the electrode connected to the specified circuit of the integrated circuit chip of the one surface and the electrode connected to the internal circuit of the integrated circuit chip of the other surface are connected to each other by a lead which is not led to the outside and a bonding wire for connecting the lead to the electrodes.

4. A semiconductor integrated circuit device as claimed in claim 2, wherein each of the integrated circuit chips is a memory chip, and the specified circuit is an address transition detector circuit.

5. A semiconductor integrated circuit device as claimed in claim 2, wherein the electrodes of the integrated circuit chips mounted on both the surfaces of the chip mounting section are each connected to a common lead terminal, and the specified circuit is an electrostatic protector circuit provided for the common lead terminal.

6. A semiconductor integrated circuit device as claimed in claim 2, wherein the output signal of the specified circuit of the integrated circuit chip of the one surface is transmitted to the integrated circuit chip of the other surface via the chip mounting section.

7. A semiconductor integrated circuit device as claimed in claim 6, wherein the specified circuit is a substrate bias generator circuit.

8. A semiconductor integrated circuit device as claimed in claim 6, wherein the specified circuit is a substrate bias generator circuit, and a threshold voltage of a MOS transistor provided inside the integrated circuit chip of the other surface is set lower than a threshold voltage when the MOS transistor is used in a state in which a bias voltage from the substrate bias generator circuit is not applied to its substrate.

9. A semiconductor integrated circuit device as claimed in claim 1, wherein the specified circuit is divided into two portions, one of the portions being included in the integrated circuit chip of the one surface of the chip mounting section and the other of the portions being included in the integrated circuit chip of the other surface of the chip mounting section.

10. A semiconductor integrated circuit device as claimed in claim 9, wherein the electrode connected to the one of the portions of the specified circuit of the integrated circuit chip of the one surface and the electrode connected to the internal circuit of the integrated circuit chip of the other surface are connected to each other, and the electrode connected to the other of the portions of the specified circuit of the integrated circuit chip of the other surface and the electrode connected to the internal circuit of the integrated circuit chip of the one surface are connected to each other, the connections each being achieved by leads which are not led to the outside and bonding wires for connecting the leads to the electrodes.

11. A semiconductor integrated circuit device as claimed in claim 9, wherein each of the integrated circuit chips is a memory chip, and the specified circuit is an address transition detector circuit.

12. A semiconductor integrated circuit device as claimed in claim 9, wherein the electrodes of the integrated circuit chips mounted on both the surfaces of the chip mounting section are each connected to a common lead terminal, and the specified circuit is an electrostatic protector circuit provided for the common lead terminal.

* * * * *